United States Patent [19]

Akimoto et al.

[11] Patent Number: 4,809,075
[45] Date of Patent: Feb. 28, 1989

[54] SOLID-STATE IMAGING DEVICE HAVING AN AMPLIFYING MEANS IN THE MATRIX ARRANGEMENT OF PICTURE ELEMENTS

[75] Inventors: Hajime Akimoto, Hachioji; Toshifumi Ozaki, Koganei; Shinya Ohba, Kanagawa, all of Japan

[73] Assignee: Hitachi, Ltd., Tokyo, Japan

[21] Appl. No.: 109,319

[22] Filed: Oct. 19, 1987

[30] Foreign Application Priority Data

Oct. 17, 1986 [JP] Japan .................................. 61-245249

[51] Int. Cl.$^4$ .............................................. H04N 3/14
[52] U.S. Cl. .................................................. 358/213.18
[58] Field of Search ...................... 358/213.11, 213.12, 358/213.15, 213.18

[56] References Cited

U.S. PATENT DOCUMENTS

| | | | |
|---|---|---|---|
| 4,363,963 | 12/1982 | Ando | 358/213.18 |
| 4,547,806 | 10/1985 | Herbst et al. | 358/213.15 |
| 4,587,562 | 5/1986 | Imai et al. | 358/213.12 |
| 4,644,401 | 2/1987 | Yamada | 358/213.11 |
| 4,678,938 | 7/1987 | Nakamura | 358/213.12 |
| 4,763,197 | 8/1988 | Masuda | 358/213.15 |

Primary Examiner—Jin F. Ng
Assistant Examiner—Stephen Brinch
Attorney, Agent, or Firm—Antonelli, Terry & Wands

[57] ABSTRACT

A solid-state imaging device is constructed by integrating a plurality of face plate elements of an imager in the shape of a matrix on a semiconductor substrate. The face plate elements are formed of photodiodes, in which charges corresponding to incident light are accumulated. The charges are converted into currents or voltages by a plurality of amplifying means disposed in the matrix and which are provided adjacent to the photodiodes. The currents or the voltages obtained through conversion are delivered out of the matrix through signal lines. To the signal lines a correlated double sampling circuit is connected, and this curcuit detects a difference in outputs of the amplifying means between a case when the charges of the photodiodes are not present in the input portions of the amplifying means and a case when they are present therein.

36 Claims, 8 Drawing Sheets

SOLID-STATE IMAGING DEVICE HAVING AN AMPLIFYING MEANS IN THE MATRIX ARRANGEMENT OF PICTURE ELEMENTS

BACKGROUND OF THE INVENTION

1. Field of the Invention

The present invention relates to an imaging device, and in particular, it relates to a solid-state imaging device in which a plurality of face plate elements of an imager are integrated on a semiconductor substrate.

2. Description of the Related Art

A solid-state imaging device needs to have the same resolving power as a pick-up tube employed for a television broadcast. Therefore, a matrix of picture elements (photoelectric conversion elements) arranged in 500 units in the vertical (column) direction and in 800 to 1000 units in the horizontal (row) direction on a semiconductor substrate, and scanning devices corresponding thereto, are necessitated. Accordingly, the aforesaid solid-state imaging device is manufactured by using MOS LSI technology enabling the realization of high integration, and a charge coupled device (hereinafter called CCD), a MOS transfer or the like is used generally as a constituent element thereof.

These prior arts will be described hereunder with reference to drawings.

FIG. 1 shows a circuit diagram of a conventional CCD type solid-state imaging device. In this figure, an example of picture elements in assumed numbers of 2×2 is cited for simplicity. In the present drawing, numerals 11, 21, 31 and 41 denote photoelectric conversion elements (photodiodes) for converting incident light into an electric charge, respectively, 6, 7, and 8 denote CCD for signal charge transfer, 901 and 902 denote driver transistors for a source follower, and 903 and 904 denote load transistors for the source follower. Besides, 501, 502 and 503 denote current buffer circuits, 504, 505 and 506 resistances, 507 and 508 capacitances, 509 and 510 switches, and 511 a power source. Components 501 to 511 form a correlated double sampling circuit 500. When light falls on the photodiodes 11, 21, 31 and 41, a signal charge corresponding to the incident light is accumulated in each photodiode. Signal charges thus accumulated are transferred sequentially to the gate of the source-follower driver transistor 901 by CCD 6, 7, and 8. An output of the source-follower driver transistor 902 is inputted to the correlated double sampling circuit 500. Moreover, the correlated double sampling circuit 500 delivers a difference between the outputs of the source-follower driver transistor 902 delivered before and after the signal charge is given thereto. In some detail, the correlated double sampling circuit 500 inputs beforehand to the capacitance 507 the output of the source-follower drive transistor 902 delivered before the signal charge is given, in the state in which the switch 509 is ON and 510 OFF. Next, in the state in which the switch 509 is OFF and 510 ON, the circuit takes out in the capacity 508 the output of the source-follower driver transistor 902 delivered after the signal charge is given. Thereby the difference between the outputs delivered before and after the signal charge is given is accumulated in the capacity 508. The device of this kind is discussed in the IEEE JOUNRAL OF SOLID-STATE CIRCUITS, Vol. SC-9, No. 1, February 1974, pp. 1 to 12.

Next, a description will be made on a MOS type solid-state imaging device with reference to FIG. 2. The present figure shows an example in which the number of picture elements is assumed to be 1 for simplicity. Numeral 11 denotes a photodiode operating like the one in FIG. 1, 601 a transistor for signal amplification, 604 a switch, 605 a load resistance, and 606 a power source. The components, a switch 602 and a power source 603, form a reset circuit. Numeral 4 denotes a signal line. When light is incident on the photodiode 11, a signal charge corresponding to the incident light is generated in the photodiode 11. This signal charge is amplified to be an electric current by the transistor 601. This current is transferred through the signal line 4 and outputted to an output end.

In the prior-art example of FIG. 1, the signal charge is transferred as an electric charge to an output amplifier 9 by using CCD 6, 7 and 8. Therefore noise mixes in the charge while it is transferred by CCD 6, 7 and 8, and this causes a problem in that S/N tends to be deteriorated by the noise charge.

Particularly, it happens that a part of incident light leaking in through a gap of a photo-shield film causes noise charge, and this charge leaks into CCD 6, 7 and 8, thus causing a large problem of a smear phenomenon.

In the prior-art example of FIG. 2, on the other hand, the nonuniformity in an output signal level, which is called an offset and caused by the nonuniformity in impurity concentration or an interface level under the gate of the charge-amplifying transistor 601 in a plurality, is outputted as it is. This nonuniformity in a gain is observed as if it were a signal, and consequently produces a proble of noise called fixed pattern noise being generated.

SUMMARY OF THE INVENTION

An object of the present invention is to furnish a solid-state imaging device which holds down the smear phenomenon and produces little noise.

The present invention provides means which is positioned adjacent to each photodiode of a face plate of an imager and whereby a charge generated by incident light is amplified and is converted to a voltage or a current, and provides, at an output end, detecting means for determining the difference in the signals outputted by the amplifying means between a case when no signal charge is present in input portions of the amplifying means and in a case when it is present therein.

Summary of the present invention will be described with reference to FIG. 3. FIG. 3 is a block diagram which illustrates schematically the concept of the present invention. The number of picture elements is assumed to be 2×2 matrix of rows and columns for simplicity. Photodiodes 11, 21, 31 and 41 are disposed in the shape of a matrix of 2×2. Amplifying means 19, 29, 39 and 49 convert the charges of photodiodes into voltages or currents, and wherein an individual amplifying means is provided for each one of the photodiodes 11, 21, 31 and 41. A signal line 4 transfers the current or the voltage from each of these amplifying means 19, 29, 39 and 49, and it connects the respective output ends of the amplifying means 19, 29, 39 and 49 to the input end of an output amplifier 9'. The output amplifier 9' amplifies the current or the voltage transferred through the signal line 4, and outputs the same to a correlated double sampling circuit 5. The correlated double sampling circuit 5 detects the difference in the outputs of amplifying means 19, 29, 39 and 49 between the case when charges from photodiodes 11, 21, 31 and 41 are present in the input portions of the amplifying means 19, 29, 39 and 49 and the case when they are absent therein. When light falls on photodiodes 11, 21, 31 and 41, a signal charge corresponding to the incident light is accumulated in each photodiode. Signal charges thus accumulated are converted sequentially into signal voltages or signal currents by the amplifying means 19, 29, 39 and 49, and these signal voltages or signal currents are inputted to the correlated double sampling circuit 5 through the output amplifier 91. From the correlation double sampling circuit 5 video signals are outputted.

While the signal charge itself is been transferred from each of photodiodes 11, 21, 31 and 41 to the output amplifier 9' in the prior art of FIG. 1, a signal voltage or a signal current obtained through conversion by each of amplifying means 19, 29, 39 and 49 is transmitted to the output amplifier 9' in the present invention. Therefore, the present invention enables the sharp reduction of deterioration of S/N which is caused by the leak of noise charge into a signal channel from each of photodiodes 11, 21, 31 and 41 to the output amplifier 9'. According to the present invention, in other words, the smear phenomenon caused by the leak-in of the noise charge being generated by incident light is reduced significantly.

The present invention provides a plurality of means to convert a charge into a voltage or a current. A problem occurring occasionally is a signal voltage called an offset which is generated when an input signal charge is absent, or when there is nonuniformity in a signal current level, and owing to this nonuniformity, noise called fixed pattern noise is generated in an output of the solid-state imaging device.

The present invention, however, makes it possible to hold down the fixed pattern noise caused by the aforesaid offset, by means of CDS circuit 5 provided for implementing a correlated double sampling method at an output end.

The present invention is able to hold down the generation of the smear phenomenon to a large extent, since it can reduce sharply the deterioration of S/N which is caused by noise charge generated by light and mixing in signals.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Embodiments of the present invention will be described hereunder with reference to the accompanying drawings.

Figure 1:
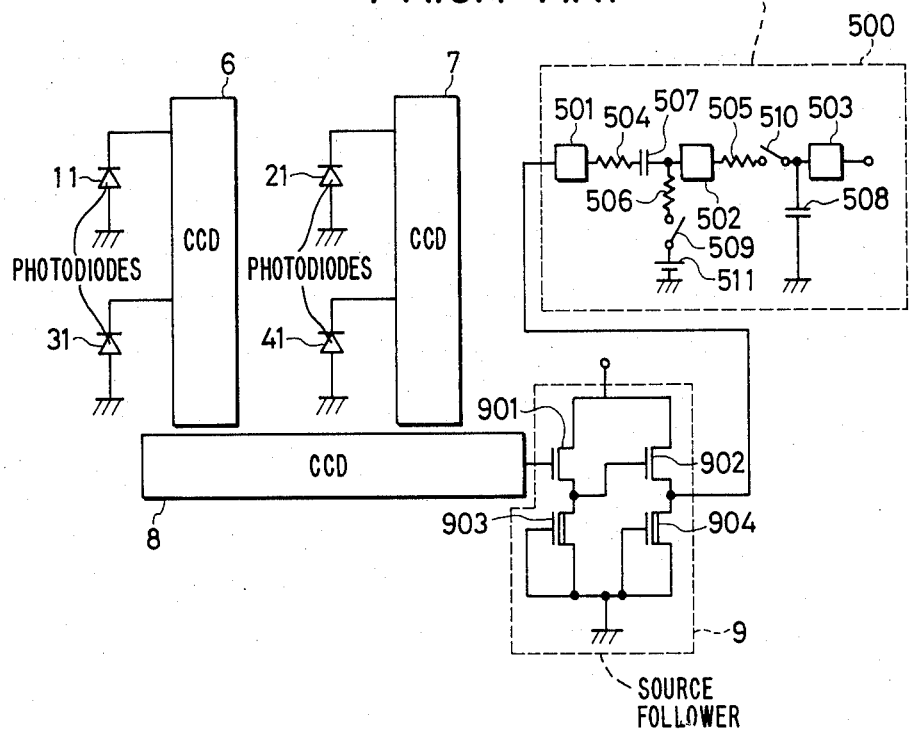
FIG. 1 shows a construction of a conventional CCD type solid-state imaging device.
Figure 2:
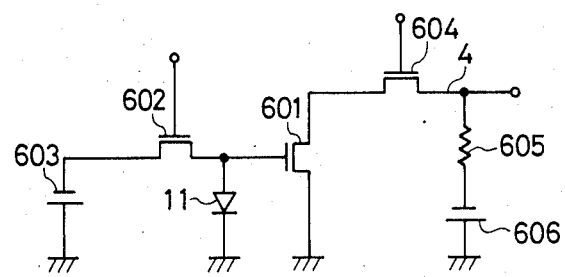
FIG. 2 shows a construction of a conventional MOS type solid-state imaging device.
Figure 3:
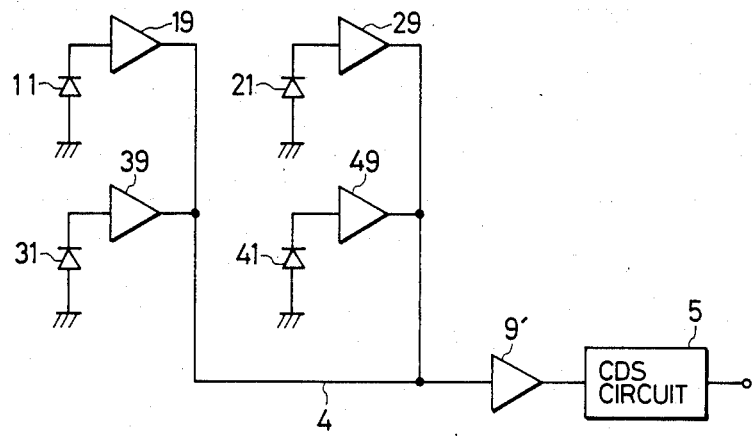
FIG. 3 shows a schematic illustration of the present invention.
Figure 4:
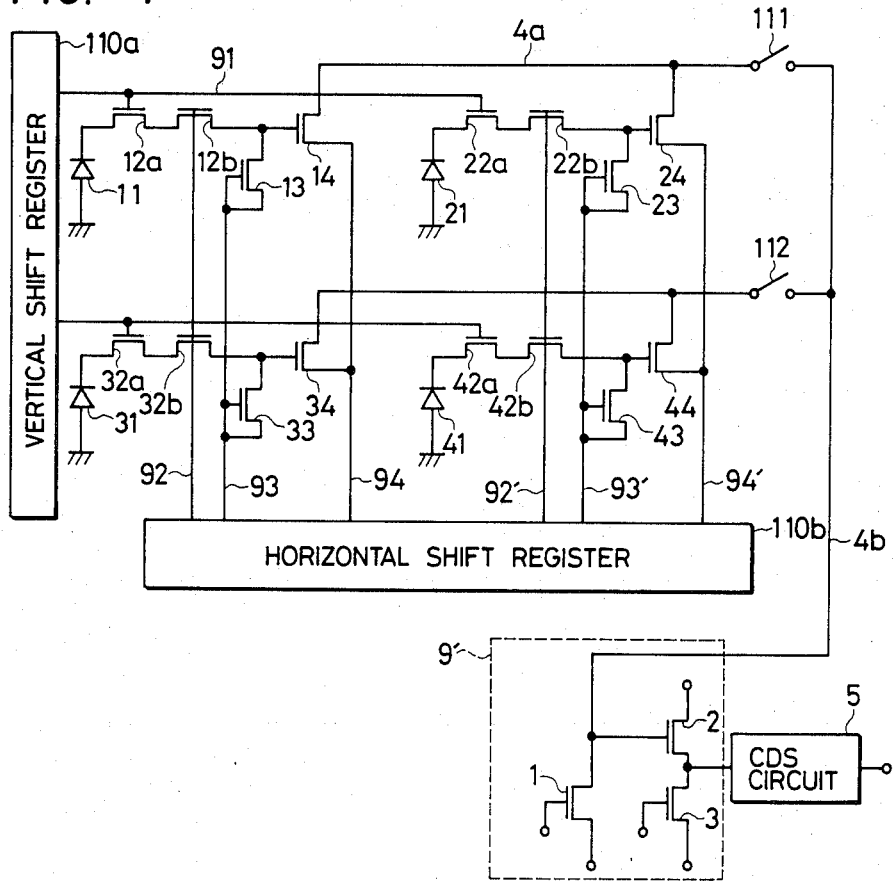
FIG. 4 shows a first embodiment of the present invention.

FIG. 4 shows a first embodiment of the present invention. This figure shows a case of picture elements of a 2×2 matrix arrangement for simplicity. One picture element is constructed of a photodiode 11, a photo-gate transistor formed of serially connected MOS transistors 12a and 12b, a reset transistor 13 and a driver transistor 14. The cathode of photodiode 11 and the drain of MOS transistor 12a are connected together. The gate of MOS transistor 12a is connected to a signal line 91 of a vertical shift register 110a wherein, and a scanning pulse from the vertical shift register 110a is inputted thereto. The source of MOS transistor 12a and the drain of MOS transistor 12b are connected together. The gate of MOS transistor 12b is connected to a signal line 92 of a horizontal shift register 110b wherein, and a scanning pulse from the horizontal shift register 110b is inputted thereto. The source of MOS transistor 12b is connected to the source of the reset transistor 13 and to the gate of the driver transistor 14, respectively. The gate and the drain of the reset transistor 13 are connected commonly to a signal line 93 of the horizontal shift register 110b. The driver transistor 14 constitutes the front stage (or first stage) of a source follower, and the drain of this transistor is connected to a signal line 94 of the horizontal shift register 110b, while the source thereof is connected to an output amplifier 9' through a signal line 4a, a switch 111 and a signal line 4b. The construction of the output amplifier 9' is the same with that of the output amplifier 9 of FIG. 1 except that the driver transistor 901 is excluded therefrom. Specifically, a transistor 1 is a load of the front stage driver transistor 14, a transistor 2 is a driver transistor for the source follower in the rear stage (or second stage), and a transistor 3 is a load of this rear stage driver transistor 2. The output end of the output amplifier 9' and the input end of a correlated double sampling circuit 5 are connected together, and video signals are outputted from the correlated double sampling circuit 5. The switch 111 is constructed of a MOS transistor or it may be constructed of other analogous type of switches wherein it repeats an ON-OFF operation in synchronization with the vertical shift register 110a. The signal line 91 is connected commonly to MOS transistors 12a and 22a in the horizontal direction, and the signal line 4a is connected also commonly to the sources of driver transistors 14 and 24 in the horizontal direction. The signal line 92 and a signal line 92' are connected commonly in the vertical direction to MOS transistors 12b, 32b and to MOS transistors 22b, 42b, respectively. The signal line 93 and a signal line 93' are connected commonly to reset transistors 13, 33 and to reset transistors 23, 43, respectively. Signal lines 94 and 94' are connected commonly to the drains of driver transistors 14, 34 and to the drains of driver transistors 24, 44, respectively.

Next, an operation of the present embodiment will be described. When light is incident on photodiodes 11, 21, 31 and 41, a signal charge corresponding to the incident light is accumulated in each photodiode. A description will be made herein regarding the read out of a signal charge in the photodiode 11. First a pulse is impressed on the reset transistor 13 from the horizontal shift register 110b through the seal line 93. The reset transistor 13 is thereby turned ON to reset the charge on the gate of the driver transistor 14. Next, a pulse is impressed on the drain of the driver transistor 14 from the horizontal shift register 110b through the signal line 94, and thereby the drain of the driver transistor 14 is turned ON. Then, the switch 111 is turned ON, and a source follower output corresponding to the gate potential of the driver transistor 14 is inputted to the correlated double sampling circuit 5 through the output amplifier 9'. In the meantime, the drains of the driver transistors 24 and 44 are OFF. Next, MOS transistors 12a and 12b are turned ON by the vertical and horizontal shift registers 110a and 110b. As a result the signal charge accumulated in the photodiode 11 is made to flow into the gate of the driver transistor 14. The reset transistor 13 is OFF during this time, and therefore the gate potential of the driver transistor 14 changes in accordance with the amount of the signal charge. A source follower output corresponding to this gate potential is inputted again to the correlated double sampling circuit 5 through the output amplifier 9'. Thereafter, the correlated double sampling circuit 5 detects an output equivalent to the difference between the aforesaid two inputs. The reading operation for the photodiode 11 is thereby completed, and a transfer is made to an operation of reading the signal of the subsequent photodiode 21.

In the above-described sequential operations, the propagation of a signal from each picture element to an output element is implemented by a voltage or a current transmitted through the signal lines 4a and 4b. In the present embodiment, therefore, the deterioration of S/N due to the leak-in of noise charge is considerably less. Accordingly, it has a very large effect of holding down the smear phenomenon that has been a problem heretofore. Also, the occurrence of offset noise in a source follower output caused by the nonuniformity in threshold voltage $V_{th}$ between the driver transistors 14, 24, 34 and 44, or the like, can be held down by using the correlated double sampling circuit 5.

Figure 5:
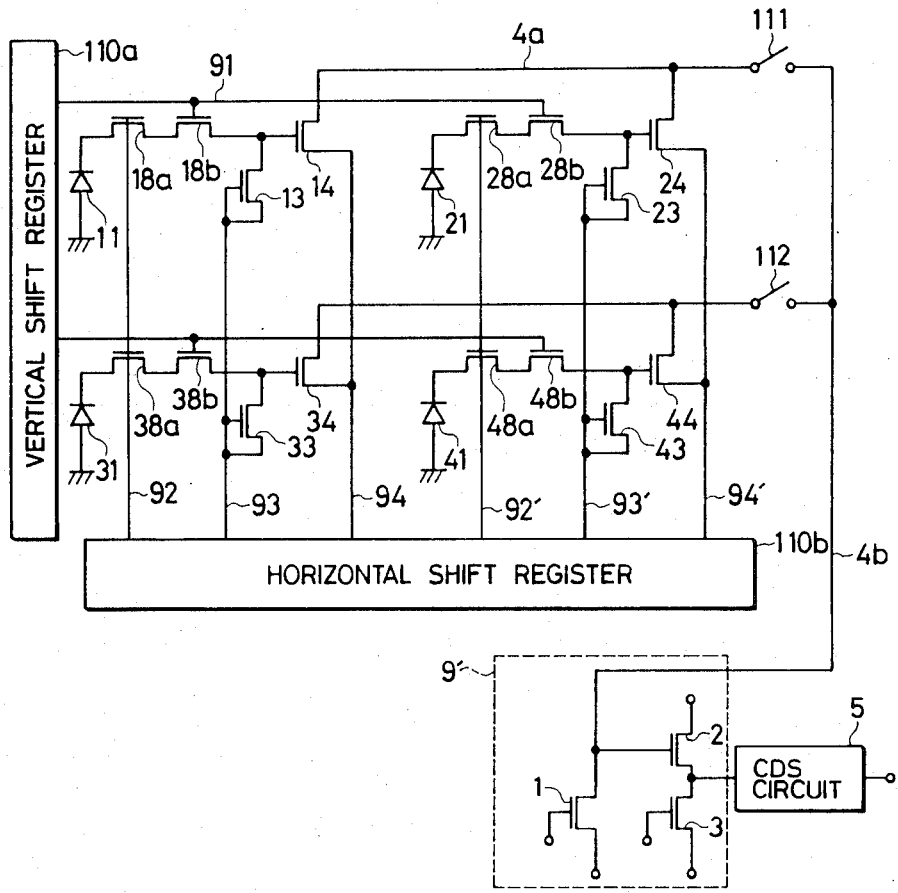
FIG. 5 is a second embodiment of the present invention.

A second embodiment of the present invention is shown in FIG. 5 to be referred to hereunder. The embodiment of FIG. 5 is the same both in structure and operation with that of FIG. 4 except for a difference therefrom in gate wirings of MOS transistors 18a and 18b constituting a photo-gate transistor. Besides, the same effect as of FIG. 4 can be obtained also by varying appropriately the longitudinal and lateral combination of wirings of a reset transistor 13 and a driver transistor 14.

Figure 6:
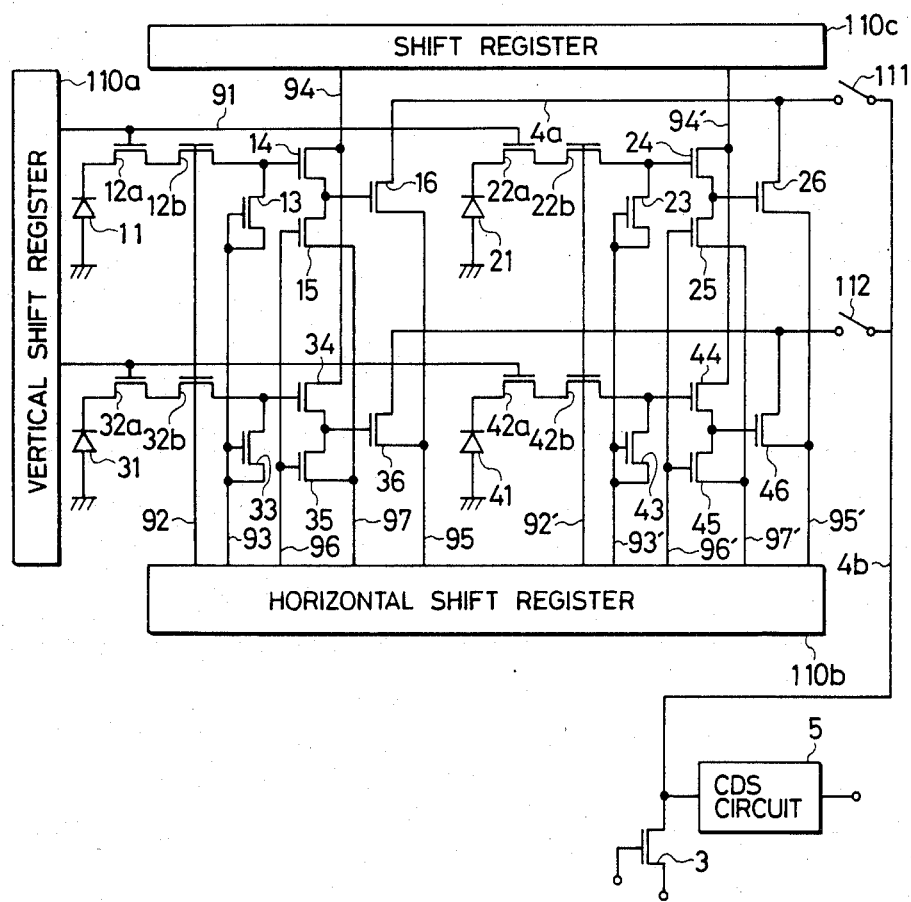
FIG. 6 shows a third embodiment of the present invention.

A third embodiment of the present invention will be shown in FIG. 6. In the embodiment of FIG. 6, source follower load transistors 15, 25, 35 and 45 in the front stage and source follower driver transistors 16, 26, 36 and 46 in the rear stage are provided for each picture element respectively, and concomitantly, gate wirings 96, 96' for the source follower load transistors 15, 25, 35, 45 in the front stage, source wirings 97, 97' therefor, drain wirings 95, 95' for the source follower driver transistors 16, 26, 36, 46 in the rear stage, and a second horizontal shift register 110c synchronized with the horizontal shift register 110b, are provided. Excepting the above, this embodiment is the same with that of FIG. 4 and it operates in the same way as that of FIG. 4. Besides, a source follower for each picture element is constructed in two stages in FIG. 6, and therefore each picture element has larger driving capability than the one in FIG. 4. In the device of FIG. 6, accordingly, each picture element can be scanned by a higher frequency, and thus an embodiment applicable suitably to a solid-state imaging device for high definition TV having a large number of picture elements can be obtained.

Figure 7:
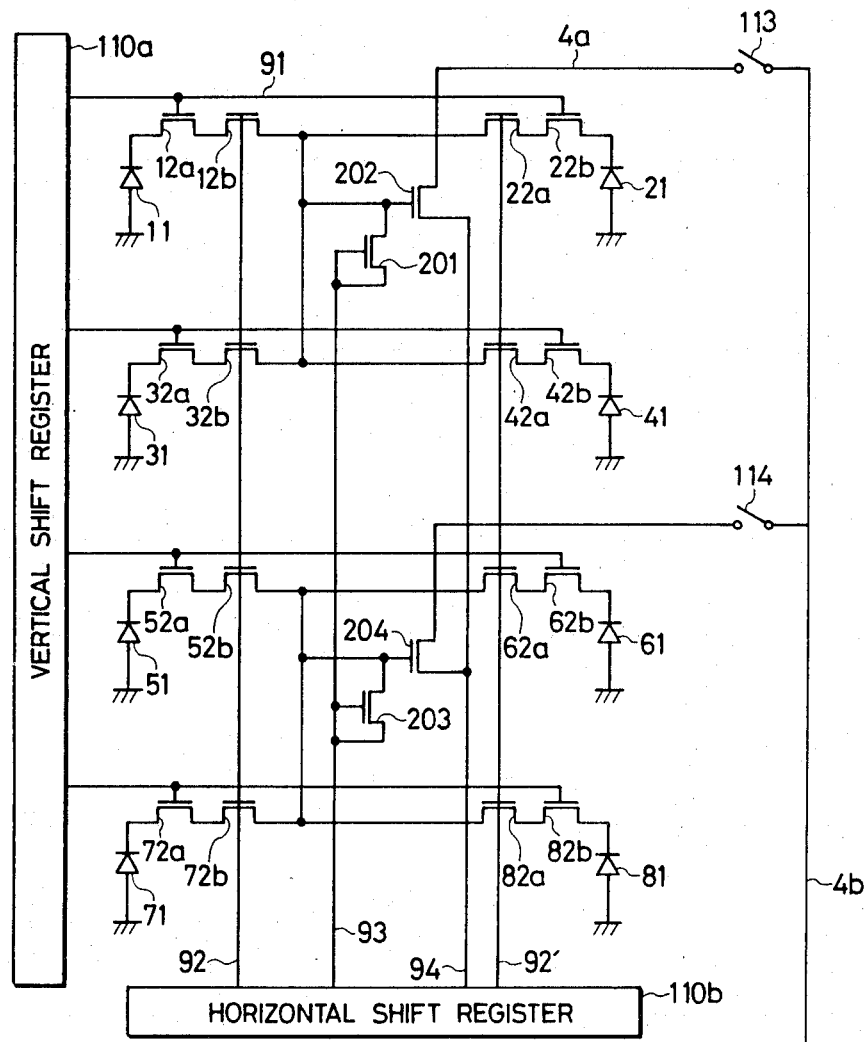
FIG. 7 shows a fourth embodiment of the present invention.

A fourth embodiment of the present invention is shown in FIG. 7. In the embodiment of FIG. 7, reset transistors 201, 203 and driver transistors 202, 204 in the front stage of the source follower are provided in the ratio of one to four picture elements, respectively. Excepting the above, this embodiment is the same with that of FIG. 4, and it operates in the same way as that of FIG. 4. For easy understanding, the number of picture elements is shown as 4×2 in FIG. 7. When all elements on the face plate of the imager are formed on the same plane, according to the embodiment of FIG. 7, the area occupied by the reset transistors 201, 203 and the driver transistors 202, 204 can be made smaller than that in the embodiment of FIG. 4, and therefore it is possible to increase the area of photodiodes so as to improve the sensitivity of the solid-state imaging device. Besides, while the reset transistors 201, 203 and the driver transistors 202, 204 are provided in the ratio of one to four picture elements in FIG. 7, an effect equivalent to the one of the embodiment of FIG. 7 can be obtained also by providing these components in the ratio of one to three picture elements or one to two.

Figure 8:
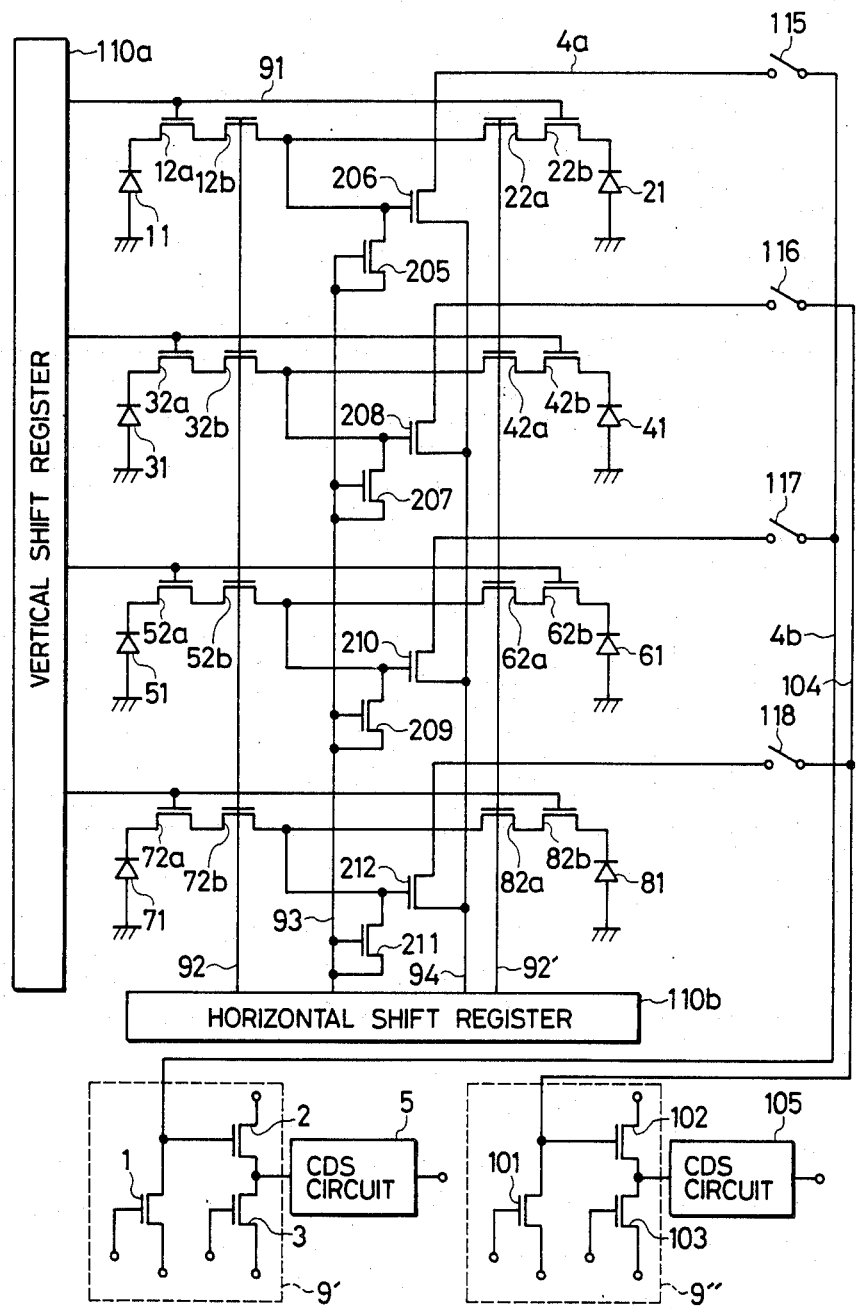
FIG. 8 shows a fifth embodiment of the present invention.

A fifth embodiment of the present invention is shown in FIG. 8. In the example of FIG. 8, reset transistors 205, 207, 209, 211 are driver transistors 206, 208, 210, 212 are provided in the ratio of one to two picture elements respectively in the same way as in the embodiment of FIG. 7. It differs from this embodiment in that an output element is divided into two systems, a system composed of transistors 1, 2, 3 and the correlated double sampling circuit 5 and a system composed of transistors 101, 102, 103 and a correlated double sampling circuit 105, and in that switches 115, 116, 117, 118 are connected alternately on every second unit to the outputs of these two systems. While the fifth embodiment operates like that of FIG. 4, it is capable of outputting signals of adjacent two lines simultaneously, since the output element thereof has two systems. When signals of adjacent but different two lines are outputted simultaneously for each field, an output corresponding to an interlace of video signals can be obtained.

Figure 9:
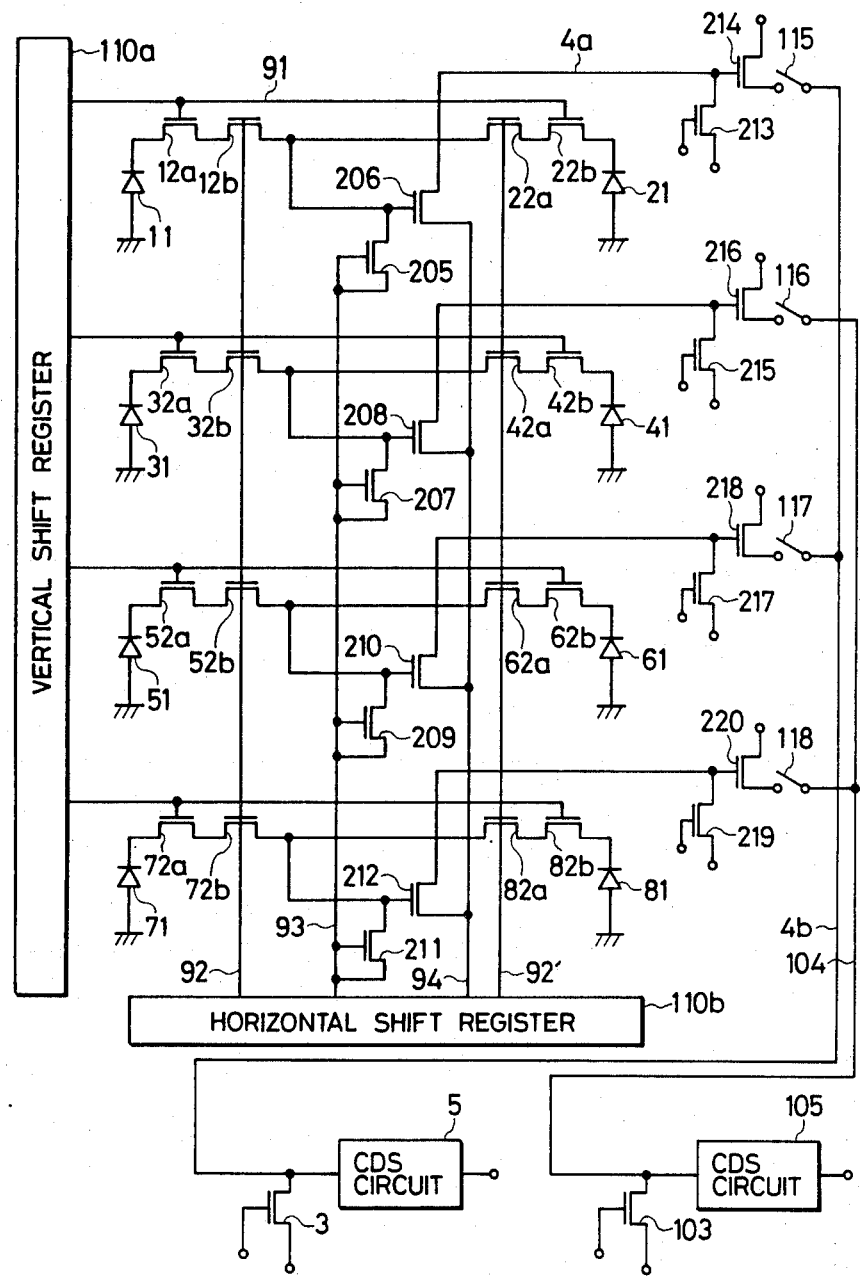
FIG. 9 shows a sixth embodiment of the present invention.

A sixth embodiment of the present invention is shown in FIG. 9. The embodiment of FIG. 9 is the same with the embodiment of FIG. 8 except that load transistors 213, 215, 217, 219 of the front-stage source follower and driver transistors 214, 216, 218, 220 of the rear-stage source follower are provided in front of the switches 115, 116, 117, 118, and it operates like that of FIG. 8. According to the sixth embodiment, the source follower in the front stage is required to drive only one lateral row of signal lines, and therefore a driving capacity can be made smaller than the one in the embodiment of FIG. 8. According to the sixth embodiment, consequently, a signal of each picture element can be outputted more speedily, and thus the solid-state imaging device for high-definition TV having a large number of picture elements, or the like, can be attained.

Figure 10:
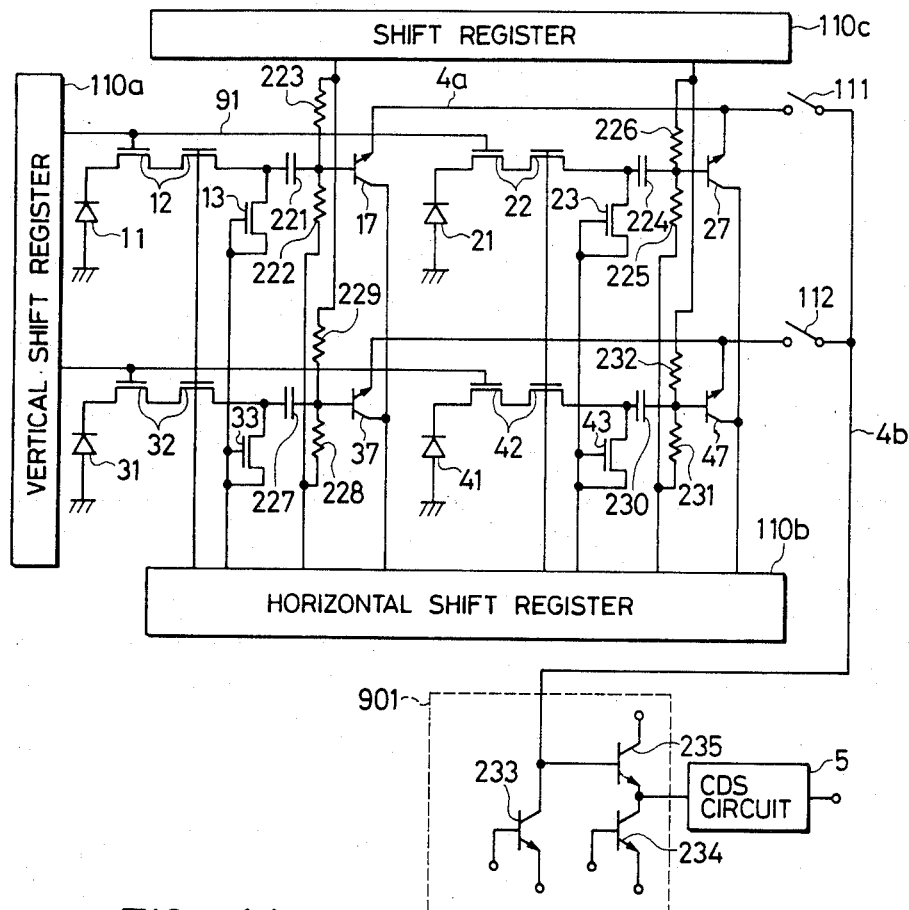
FIG. 10 shows a seventh embodiment of the present invention.

A seventh embodiment of the present invention is shown in FIG. 10. The embodiment of FIG. 10 is the same with that of FIG. 4 except that the source followers in the front and rear stages are replaced by emitter followers consisting of bipolar transistors 17, 27, 37, 47, 233, 234, 235, and that capacitances 221, 224, 227, 230 and resistances 222, 223, 225, 226, 228, 229, 231, 232 give an operating point bias to the bases of driver transistors of each front-stage emitter follower, and it operates in the same way as the embodiment of FIG. 4. Generally, a larger driving capability can be obtained by using an emitter circuit than by using a source follower circuit. According to the seventh embodiment, the signal of each picture element can be outputted more speedily, and thus the solid-state imaging device for high-definition TV having a large number of picture elements, or the like, can be obtained.

Figure 11:
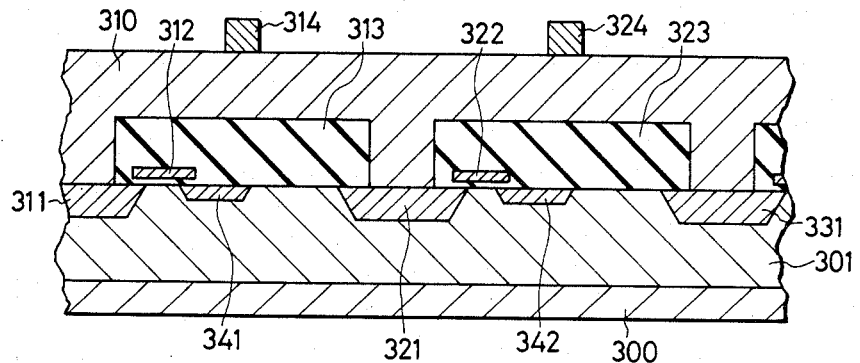
FIG. 11 shows a sectional structure of a picture element member common to each embodiment from FIG. 4 to FIG. 10.

FIG. 11 shows a part of the section of a picture element portion of one embodiment of the present invention, and the embodiments of FIG. 4 to FIG. 10 correspond to the circuit diagram thereof. Any embodiment other than the above can be facilitated to likewise correspond to the present embodiment on the condition that it satisfies the conditions intended by the the present invention. In addition, it is apparent that the circuit diagrams shown in FIGS. 4 to 10 may be realized by a conventional planar process, although the description thereof is omitted herein. Numerals 311, 321 and 331 denote photodiodes, 312 and 322 gate electrodes of photo-gate transistors, 341 and 342 drains of the photo-gate transistors, 310 amorphous silicon or crystallized silicon, 313 and 323 insulators of $SiO_2$ or the like, 314 and 324 photo-shield substances of Al or the like, 300 a semiconductor substrate, and 301 a well. Among these elements, 311, 321, 331, 341, 342 and 300, for instance, are n-type semiconductors and 310 and 301 p-type semiconductors, while types of n and p may be reversed to the above. Although such elements as reset transistors and driver transistors other than the photo-gate transistors 312, 322, 341 and 342 are omitted from FIG. 11, these elements are also formed on substrate 300 like the photo-gate transistors 312, 322, 341 and 342. While the operation of the present embodiment is the same with respective the foregoing embodiments of FIGS. 4 to 10, a region 310 which is used for receiving light and a scanning region on the substrate 300 are superposed vertically in two layers, especially in the present embodiment. Therefore the ratio of a photoelectric conversion region to the whole of the face plate of the imager can be made large considerably, and thus the sensitivity of an imaging element can be made very high even with respect to a small face plate of the imager. Besides, the photo-shield substances 314 and 324 are provided for isolating photoelectric conversion regions from one another and improving the quality of a picture, though they may be dispensed with.

While it is assumed that photodiodes are provided in the photoelectric conversion regions in the above embodiments, they may be replaced by MOS capacitances or other elements having a photoelectric conversion characteristic. As for means to convert a signal charge into a signal voltage or a signal current, a two-stage source follower circuit comprising MOS transistors and a two-stage emitter follower circuit comprising bipolar transistors are used an illustrated for purposes of exemplifying the invention. However, they may be replaced by a one-stage source or emitter follower circuit or another circuit of which the nonuniformity in a gain is very small. In the operations of the embodiments, the reset transistor 13 is turned ON first. Regarding the timing of reset, however, an effect equivalent to the effect of operations of the embodiments is produced also by executing the reset at an arbitrary number of times at another arbitrary timing except for a period when the photo-gate transistors 12a and 12b are turned ON and an output on the occasion is inputted to the correlated double sampling circuit 5. As for the circuit diagrams shown in FIGS. 4 to 10, no hindrance is caused in general even by making common some of portions of the transistors in the figures which are located apart in a circuit, e.g. all the drains of the reset transistors 12, 23, 33 and 43, and the like, such as by using multi-drain MOS transistors.

In addition, it is possible, of course, to construct an output element in FIGS. 4, 5, 6 and 10 in the same way as in FIG. 8 or 9 so as to realize simultaneous output of picture element signals of two lines and to attain high definition of an image.

What is claimed is:

1. A solid-state imaging device comprising:
   a plurality of photoelectric conversion elements accumulating charges corresponding to light information;
   a plurality of amplifying means each one having an input and being coupled to receive charges in at least one of said photoelectric conversion means for converting the respective charges accumulated in said photoelectric conversion elements into current or voltage signals and outputting amplified signals thereof;
   a transfer means for transferring signals outputted by said plurality of amplifying means to an output end; and
   detecting means, coupled to said output end, for detecting with respect to each one of said photoelectric conversion elements the difference between those signals outputted by said plurality of amplifying means corresponding to when charges, indicative of light information, are present at inputs of the respective amplifying means from those signals outputted when light information indicative charges are not present at said inputs.

2. A solid-state imaging device according to claim 1, wherein a separate amplifying means is provided for each one of said plurality of photoelectric conversion elements.

3. A solid-state imaging device according to claim 1, wherein each one said amplifying means has its input coupled so as to be responsive to the charges accumulated in four of said plurality of photoelectric conversion elements.

4. A solid-state imaging device according to claim 1, wherein each one of said amplifying means has its input coupled so as to be responsive to the charges accumulated in two of said plurality of photoelectric conversion elements.

5. A solid-state imaging device according to claim 1, further including an output amplifier coupled between said output end and said detecting means.

6. A solid-state imaging device according to claim 1, wherein said detecting means comprises a correlated double sampling circuit.

7. A solid-state imaging device according to claim 5, wherein said detecting means comprises a correlated double sampling circuit.

8. A solid-state imaging device according to claim 5, wherein each one of said plurality of amplifying means comprises a first non-inverting amplifier stage and said output amplifier comprises at least one second non-inverting amplifier stage.

9. A solid-state imaging device according to claim 8, wherein said first and second non-inverting amplifier stages comprise MOS transistor type source follower circuits, each one including a source follower MOS transistor and a load MOS transistor connected in series therewith.

10. A solid-state imaging device according to claim 8, wherein said first and second non-inverting amplifier stages comprise bipolar transistor emitter follower circuits, each one including an emitter follower connected bipolar transistor and a corresponding load bipolar transistor connected in series therewith.

11. A solid-state imaging device according to claim 1, wherein each one of said plurality of amplifying means has its input coupled to at least one of said plurality of photoelectric conversion elements via a respective pair of time-actuated series-connected switches and wherein there is further included a plurality of reset means for providing predetermined initial input signal values at the inputs of said plurality of amplifying means.

12. A solid-stage imaging device according to claim 11, further including at least one output amplifier coupled between the respective outputs of said plurality of amplifying means and said detecting means.

13. A solid-stage imaging device according to claim 12, wherein said at least one output amplifier comprises a single amplifier stage having an input coupled to the output of said plurality of amplifier means via said transfer means.

14. A solid-state imaging device according to claim 13, wherein said plurality of amplifying means correspond in number to the number of said plurality of photoelectric conversion elements, each of said amplifying means has its input coupled to a different one of said photoelectric conversion elements via a respective pair of time-actuated series-connected switches and wherein there is further included a plurality of reset means each coupled to the input of an amplifying means for providing a predetermined initial signal value thereat.

15. A solid-stage imaging device according to claim 13, wherein each one of said plurality of amplifying means has its input coupled to a pair of photoelectric conversion elements via respective pairs of time-actuated series-connected switches and wherein there is further included a plurality of reset means each one coupled to be the input of an amplifying means for providing a predetermined initial signal value thereat.

16. A solid-stage imaging device according to claim 13, wherein each one of said plurality of amplifying means has its input respectively coupled to four photoelectric conversion elements via individual pairs of time-actuated series-connected switches and wherein there is further included a plurality of reset means each one coupled to the input of an amplifying means for providing a predetermined initial signal value thereat.

17. A solid-state imaging device according to claim 12, wherein said at least one output amplifier comprises a plurality of output amplifiers each one having an input coupled to the outputs of a group of said plurality of amplifying means via said transfer means and having an output coupled to a respective correlated double sampling circuit.

18. A solid-state imaging device according to claim 17, wherein said plurality of amplifying means correspond in number to the number of said plurality of photoelectric conversion elements, each of said amplifying means has its input coupled to a different one of said photoelectric conversion elements via a respective pair of time-actuated series-connected switches and wherein there is further included a plurality of reset means each coupled to the input of an amplifying means for providing a predetermined initial signal value thereat.

19. A solid-state imaging device according to claim 17, wherein each one of said plurality of amplifying means has its input coupled to a pair of photoelectric conversion elements via respective pairs of time-actuated series-connected switches and wherein there is further included a plurality of reset means each one coupled to the input of an amplifying means for providing a predetermined initial signal value thereat.

20. A solid-state imaging device according to claim 17, wherein each one of said plurality of amplifying means has its input respectively coupled to four photoelectric conversion elements via individual pairs of time-actuated series-connected switches and wherein there is further included a plurality of reset means each one coupled to the input of an amplifying means for providing a predetermined initial signal value thereat.

21. A solid-state imaging device claim 12, wherein said at least one output amplifier comprise a plurality of non-inverting stages each one having an input coupled to an output of a respective one of said plurality of amplifying means and an output selectively coupled to an input of a correlated double sampling circuit via said transfer means.

22. A solid-state imaging device according to claim 21, wherein said plurality of non-inverting stages have a common load coupled in series therewith and, coupled to the input of said correlated double sampling circuit.

23. A solid-state imaging device according to claim 22, wherein said plurality of amplifying means correspond in number to the number of said plurality of photoelectric conversion elements, each of said amplifying means has its input coupled to a different one of said photoelectric conversion elements via a respective pair of time-actuated series-connected switches and wherein there is further included a plurality of reset means each coupled to the input of an amplifying means for providing a predetermined initial signal value thereat.

24. A solid-state imaging device according to claim 22, wherein each one of said plurality of amplifying means has its input coupled to a pair of photoelectric conversion elements via respective pairs of time-actuated series-connected switches and wherein there is further included a plurality of reset means each one coupled to be the input of an amplifying means for providing a predetermined initial signal value thereat.

25. A solid-state imaging device according to claim 22, wherein each one of said plurality of amplifying means has its input respectively coupled to four photoelectric conversion elements via individual pairs of time-actuated series-connected switches and wherein there is further included a plurality of reset means each one coupled to the input of an amplifying means for providing a predetermined initial signal value thereat.

26. A solid-state imaging device comprising:
a plurality of photoelectric conversion elements, arranged in the form of a matrix array having a plurality of rows and columns, for accumulating charges corresponding to light information;

a plurality of amplifying means for converting the charges accumulated in each of said photoelectric conversion elements into currents or voltages and for amplifying the same, each of said amplifying means having an input and an output;

a plurality of selectively actuated switching means coupling said plurality of photoelectric conversion elements to respective inputs of said plurality of amplifying means, said switching means selecting a prescribed one of said plurality of photoelectric conversion elements so as to supply accumulated charges thereat to an input of said amplifying means;

a plurality of resetting means for resetting the charges at the inputs of said amplifying means;

signal lines for transferring to outside said matrix array the currents or voltages outputted by said amplifying means located within said matrix array; and detecting means, coupled to said signal lines, for detecting with respect to each one of said photoelectric conversion elements the difference between signals outputted by said amplifying means corresponding to reset charge levels at the inputs of said amplifying means and those signals corresponding to when charges, indicative of light information, are present at the inputs thereof.

27. A solid-state imaging device according to claim 26, wherein a separate amplifying means is provided for each one of said plurality of photoelectric conversion elements.

28. A solid-state imaging device according to claim 26, wherein each one of said amplifying means has its input coupled so as to be responsive to the charges accumulated in four of said plurality of photoelectric conversion elements.

29. A solid-state imaging device according to claim 26, wherein each one of said amplifying means has its input coupled so as to be responsive to the charges accumulated in two of said plurality of photoelectric conversion elements.

30. A solid-state imaging device according to claim 26, further including an output amplifier coupled further between said signal lines and said detecting means.

31. A solid-state imaging device according to claim 26, wherein said detecting means comprises a correlated double sampling circuit.

32. A solid-state imaging device according to claim 30, wherein said detecting means comprises a correlated double sampling circuit.

33. A solid-state imaging device according to claim 32, wherein each one of said plurality of amplifying means comprises a first non-inverting amplifier stage and said output amplifier comprises at least one second non-inverting amplifier stage.

34. A solid-state imaging device according to claim 33, wherein said first and second non-inverting amplifier stages comprise MOS transistor type source follower circuits, each one including a source follower MOS transistor and a load MOS transistor connected in series therewith.

35. A solid-state imaging device according to claim 33, wherein said first and second non-inverting amplifier stages comprise bipolar transistor emitter follower circuits, each one including an emitter follower connected bipolar transistor and a corresponding load bipolar transistor connected in series therewith.

36. A solid-state imaging device according to claim 33, wherein each one of said amplifying means has its input coupled to at least one of said plurality of photoelectric conversion elements via a corresponding switching means including a pair of series-connected transistor switches time-actuated in response to vertical and horizontal scanning pulses for said rows and columns of said matrix array.

* * * * *